United States Patent
Chen et al.

(10) Patent No.: US 9,349,986 B2
(45) Date of Patent: May 24, 2016

(54) OLED DISPLAY DEVICE, METHOD FOR MANUFACTURING THE SAME, AND OLED DISPLAY APPARATUS

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Changdi Chen, Beijing (CN); Xiangwan Lu, Beijing (CN); Yiyong Luo, Beijing (CN); Tao Yang, Beijing (CN)

(73) Assignees: BOE TECHNOLOGY GROUP CO., LTD. (CN); HEPEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/422,091

(22) PCT Filed: May 20, 2014

(86) PCT No.: PCT/CN2014/077886
§ 371 (c)(1),
(2) Date: Feb. 17, 2015

(87) PCT Pub. No.: WO2015/089986
PCT Pub. Date: Jun. 25, 2015

(65) Prior Publication Data
US 2015/0228925 A1    Aug. 13, 2015

(30) Foreign Application Priority Data
Dec. 20, 2013 (CN) .......................... 2013 1 0713135

(51) Int. Cl.
*H01L 51/00* (2006.01)
*H01L 35/24* (2006.01)
(Continued)

(52) U.S. Cl.
CPC ........ *H01L 51/5253* (2013.01); *H01L 27/3244* (2013.01); *H01L 51/506* (2013.01);
(Continued)

(58) Field of Classification Search
CPC ....... H01L 51/00; H01L 35/24; H01L 51/529; H01L 51/5012; H01L 51/5048
USPC .......................................................... 257/40
See application file for complete search history.

(56) References Cited

U.S. PATENT DOCUMENTS

2002/0135296 A1* 9/2002 Aziz .................. H01L 51/5012
                                                      313/504
2003/0117066 A1* 6/2003 Silvernail ............ H01L 51/5237
                                                      313/504

(Continued)

FOREIGN PATENT DOCUMENTS

CN         1773745 A    5/2006
CN         1880377 A   12/2006

(Continued)

OTHER PUBLICATIONS

Office Action in Chinese Patent Application No. 201310713135.8, dated Jan. 11, 2016.

(Continued)

*Primary Examiner* — Phuc Dang
(74) *Attorney, Agent, or Firm* — Baker Hostetler LLP

(57) ABSTRACT

The present disclosure provides an OLED display device, a method for manufacturing the same, and an OLED display apparatus. The OLED device includes: a base substrate, an anode layer, a hole injection layer, a hole transport layer, a light emitting material layer, an electron transport layer, an electron injection layer, a cathode layer and a packaging layer, wherein the hole injection layer, the hole transport layer, the electron transport layer and/or the electron injection layer are doped with a water-absorbing organic compound and an oxygen-absorbing organic compound.

13 Claims, 1 Drawing Sheet

(51) Int. Cl.
  *H01L 51/52* (2006.01)
  *H01L 51/56* (2006.01)
  *H01L 27/32* (2006.01)
  *H01L 51/50* (2006.01)

(52) U.S. Cl.
  CPC ........ *H01L51/5012* (2013.01); *H01L 51/5076* (2013.01); *H01L 51/5088* (2013.01); *H01L 51/5092* (2013.01); *H01L 51/5206* (2013.01); *H01L 51/5221* (2013.01); *H01L 51/56* (2013.01); *H01L 51/005* (2013.01); *H01L 51/008* (2013.01); *H01L 51/0058* (2013.01); *H01L 51/0061* (2013.01); *H01L 51/0067* (2013.01); *H01L 51/0072* (2013.01); *H01L 51/0077* (2013.01); *H01L 51/0079* (2013.01); *H01L 51/0081* (2013.01); *H01L 51/0091* (2013.01); *H01L 51/5016* (2013.01); *H01L 51/5036* (2013.01); *H01L 51/5259* (2013.01); *H01L 2251/301* (2013.01)

(56) References Cited

U.S. PATENT DOCUMENTS

| | | |
|---|---|---|
| 2006/0063030 A1 | 3/2006 | Deaton et al. |
| 2006/0260679 A1 | 11/2006 | Aratani et al. |
| 2007/0184300 A1 | 8/2007 | Yokose et al. |
| 2010/0244062 A1* | 9/2010 | Ueno ............... B82Y 20/00 257/90 |
| 2010/0244675 A1* | 9/2010 | Cheng ............... C07F 15/0033 313/504 |
| 2011/0121271 A1* | 5/2011 | Jeon ............... H01L 51/5253 257/40 |
| 2014/0014937 A1* | 1/2014 | Ide ............... H01L 51/5044 257/40 |
| 2015/0129846 A1* | 5/2015 | Lang ............... H01L 51/5253 257/40 |

FOREIGN PATENT DOCUMENTS

| | | |
|---|---|---|
| CN | 101022155 A | 8/2007 |
| CN | 101369635 A | 2/2009 |
| CN | 101740724 A | 6/2010 |
| CN | 101866944 A | 10/2010 |
| CN | 102157703 A | 8/2011 |
| CN | 103681768 A | 3/2014 |
| JP | 2005-000792 A | 1/2005 |
| JP | 2007-242831 A | 9/2007 |

OTHER PUBLICATIONS

Office Action in Chinese Patent Application No. 201310713135.8, dated Sep. 7, 2015.

International Search Report and Written Opinion in PCT International Application No. PCT/CN2014/077886, dated Sep. 17, 2014.

* cited by examiner

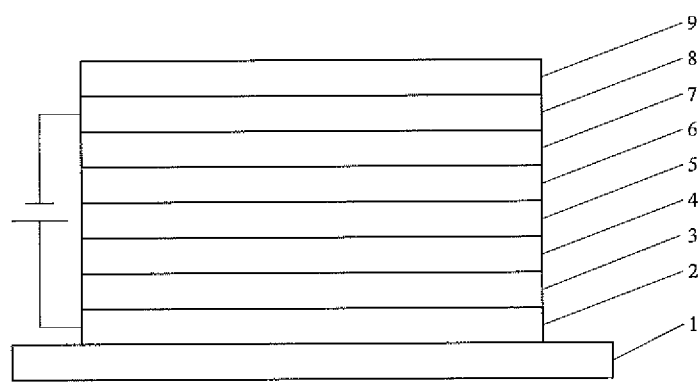

OLED DISPLAY DEVICE, METHOD FOR MANUFACTURING THE SAME, AND OLED DISPLAY APPARATUS

CROSS-REFERENCE TO RELATED APPLICATION

The present application is the U.S. national phase of PCT Application No. PCT/CN2014/077886 filed on May 20, 2014, which claims priority to Chinese Patent Application No. 201310713135.8 filed on Dec. 20, 2013, the disclosures of which are incorporated in their entirety by reference herein.

TECHNICAL FIELD

The present disclosure relates to the field of display technology, in particular relates to an OLED display device, a method for manufacturing the same, and an OLED display apparatus including the display device.

BACKGROUND

The Organic Light Emitting Diode (OLED) is expected to become a Next-Generation display technology, which can replace the Thin Film Transistor-Liquid Crystal Display (TFT-LCD) by virtue of its advantages such as wider viewing angle, lower power consumption, more rapid response, higher brightness, lower cost, and the like. The OLED technology has been researched and developed maturely in lab, however, there are still some problems existing in mass production and application, in which one extremely important problem is the short serving-life. It has been well known that the OLED is a display device being extremely sensitive to stream and oxygen, particularly to the stream. Specifically, if the OLED is penetrated with steam and oxygen from the environment where the OLED is located, then it is easy to form a black spot in the light emitting area, and the black spot will be expanded with extending time. At present, a major solution for solving the above problem is to package the OLED, which mainly includes the cover packaging technology such as the metal cover and the glass cover, and the film packaging technology represented by Barix thin film packaging layer which is developed by Vitex Systems Company. However, these existing techniques are either difficult to get flat surface (such as the metal cover), or are easy to generate micro-cracks (such as the glass cover), or have a high cost, or have complex manufacturing processes (such as the Barix thin film packaging technology). Thus, it still needs to further explore a novel structure of OLED and technology thereof in terms of resistance to water and oxygen.

SUMMARY

An object of the present disclosure is to eliminate or reduce the influence on OLED serving-life by water and oxygen from external environment.

In order to solve the above-described problems, embodiments of the present disclosure provide an OLED display device, comprising: a base substrate, an anode layer, a hole injection layer, a hole transport layer, a light emitting material layer, an electron transport layer, an electron injection layer, a cathode layer and a packaging layer, wherein the hole injection layer, the hole transport layer, the electron transport layer and/or the electron injection layer are doped with a water-absorbing organic compound and an oxygen-absorbing organic compound.

According to an embodiment of the present disclosure, a mass sum of the water-absorbing organic compound and the oxygen-absorbing organic compound doped in any one of the hole injection layer, the hole transport layer, the electron transport layer and the electron injection layer is 1/1000 or less of a total mass of each layer.

According to an embodiment of the present disclosure, the water-absorbing organic compound is aluminum-based composite, and the oxygen-absorbing organic compound is ascorbic acid and a derivative thereof.

According to an embodiment of the present disclosure, the hole injection layer is made of F4TCNQ, TCNQ, PPDN, CuPC or TiOPC.

According to an embodiment of the present disclosure, the hole transport layer is made of F4TCNQ, TCNQ, PPDN, CuPC, TiOPC or TCTA.

According to an embodiment of the present disclosure, the electron transport layer is made of BCP, Bphen, TPBi, Alq3, Liq, Nbphen or TAZ.

According to an embodiment of the present disclosure, the electron injection layer is made of LiF, LiBq4 or Alq3:Li$_3$N.

Embodiments of the present disclosure also provide an OLED display apparatus, which includes any one of the above-described OLED display device and a drive circuit.

Embodiments of the present disclosure also provide a method for manufacturing an OLED display device, which includes steps of providing a base substrate; forming an anode layer; forming a hole injection layer; forming a hole transport layer; forming a light emitting material layer; forming an electron transport layer; forming an electron injection layer; forming a cathode layer; and forming a packaging layer, wherein the method further comprises the step of doping a water-absorbing organic compound and an oxygen-absorbing organic compound into the hole injection layer, the hole transport layer, the electron transport layer and/or the electron injection layer; or into materials for forming the hole injection layer, the hole transport layer, the electron transport layer and/or the electron injection layer.

According to an embodiment of the present disclosure, a mass sum of the water-absorbing organic compound and the oxygen-absorbing organic compound doped in any one of the hole injection layer, the hole transport layer, the electron transport layer and the electron injection layer is 1/1000 or less of a total mass of each layer.

In the OLED display device, the method for manufacturing the same, and the OLED display apparatus provided by the above-described technical solution, the hole injection layer, the hole transport layer, the electron injection layer and the electron transport layer are doped with a trace of the water-absorbing organic compound and the oxygen-absorbing organic compound. The water-absorbing organic compound preferentially reacts with stream to consume the stream within the apparatus, and the oxygen-absorbing organic compound preferentially reacts with oxygen to consume the trace of penetrated oxygen because it has a strong reducibility and is easy to be oxidized, thereby to prevent the trace of water and oxygen penetrating into the light emitting material layer from environment, avoid generating badness such as dark spots in the light emitting area, and improve a display quality and a display serving-life. At the same time, it may also protect other organic function layers, and effectively avoid the erosion by water and oxygen, thereby to effectively prolong the serving-life of the OLED display device.

BRIEF DESCRIPTION OF THE DRAWINGS

FIG. 1 is a schematic view showing an OLED display device according to an embodiment of the present disclosure.

1: base substrate; 2: anode layer; 3: hole injection layer; 4: hole transport layer; 5: light emitting material layer; 6: electron transport layer; 7: electron injection layer; 8: cathode layer; 9: packaging layer.

DETAILED DESCRIPTION

Specific embodiments of the present disclosure are described in details in conjunction of drawings and examples below. And the examples described hereinafter are only used to explain the present disclosure, but not intended to limit the present disclosure.

An OLED display device provided by the present disclosure is a white OLED display device with a top emitting structure. As shown in FIG. 1, the OLED display device mainly includes a base substrate 1, and an anode layer 2, a hole injection layer 3, a hole transport layer 4, a light emitting material layer 5, an electron transport layer 6, an electron injection layer 7, a cathode layer 8 and a thin film layer 9 for packaging (i.e., a packaging layer) which are formed on the base substrate 1 (e.g., a glass base substrate) in turn. All of the electron injection layer 7, the electron transport layer 6, the hole injection layer 3 and the hole transport layer 4 are doped with a trace of a water-absorbing organic compound and an oxygen-absorbing organic compound. Based on a total mass of any one layer selected from the hole injection layer, the hole transport layer, the electron transport layer and the electron injection layer, a mass sum of the water-absorbing organic compound and the oxygen-absorbing organic compound doped in each layer is $1/1000$ or less.

According to the above-described white OLED display device with the top-emitting structure provided by an embodiment of the present disclosure, a trace of the water-absorbing organic compound and the oxygen-absorbing organic compound, which are doped in the electron injection layer 7, the electron transport layer 6, the hole injection layer 3 and the hole transport layer 4, preferentially reacts with steam and oxygen respectively, penetrated from environment, thereby to avoid the dark spots emerging in the light emitting area caused by the trace of steam and oxygen therein, and further improve the display quality and the serving-life. Besides, it may also protect other organic function layers from being eroded by steam and oxygen, which might decrease the serving-life of the OLED display device. According to such embodiment of the present disclosure, it may avoid the erosion by efficiently blocking the steam and oxygen penetrating into the apparatus from environment without increasing cost, so as t improve the serving-life of the OLED.

A specific structure and a process for manufacturing an OLED display device according to embodiments of the present disclosure are described below.

Specifically, a material of the base substrate is preferably a glass, or may be transparent materials such as a plastic. The anode layer located on the base substrate may be a high working function material, preferably is transparent indium tin oxide (ITO), or may be materials such as carbon nanotube (CNT). The ITO may be deposited on the glass substrate by a vacuum magnetron sputtering method.

The hole injection layer is deposited on the ITO anode layer by a vacuum thermal evaporation method. In an example of the present disclosure, the hole injection layer may be made of copper phthalocyanine (CuPc) having an excellent hole injection ability, or may be made of 2,3,5,6-tetrafluoro-7,7',8,8'-tetracyanoquinodimethane (F4TCNQ), tetracyanoquinodimethane (TCNQ), phenanthroline-2,3-dinitrile (PPDN), or titanyl-phthalocyanine (TiOPC). The precursor materials used for the hole injection layer, for example a copper phthalocyanine precursor, may be doped with the water-absorbing organic compound prior to being thermal evaporated. In an example of the present disclosure, the water-absorbing organic compound may be an aluminum-based composite. In a further example of the present disclosure, the water-absorbing organic compound may have a doping mass fraction of $1/1000$ or less. In another example of the present disclosure, the doping mass fraction of the water-absorbing organic compound may be $5/10000$. Furthermore, the precursor materials used for the hole injection layer, for example a copper phthalocyanine precursor, may be also doped with the oxygen-absorbing organic compound having a doping mass fraction of $5/10000$ prior to being thermal evaporated. According to an example of the present disclosure, the oxygen-absorbing organic compound may be ascorbic acid and a derivative thereof, which are easy to be oxidized. Because only a trace of the water-absorbing organic compound and the oxygen-absorbing organic compound are doped, the hole injection ability of the hole injection layer may not be affected.

The hole transport layer is deposited on the hole injection layer by the vacuum thermal evaporation method. In an example of the present disclosure, the hole transport layer may be made of 4,4',4''-tri(carbazole-9-yl)triphenylamine (TCTA) having an excellent hole transport ability, or may be made of 2,3,5,6-tetrafluoro-7,7',8,8'-tetracyanoquinodimethane (F4TCNQ), tetracyanoquinodimethane (TCNQ), phenanthroline-2,3-dinitrile (PPDN), copper phthalocyanine (CuPC) or titanyl-phthalocyanine (TiOPC). The precursor materials used for the hole transport layer, for example a TCTA precursor, may be doped with the water-absorbing organic compound prior to being thermal evaporated. In an example of the present disclosure, the water-absorbing organic compound may be an aluminum-based composite. In a further example of the present disclosure, the water-absorbing organic compound may have a doping mass fraction of $1/1000$ or less. In another example of the present disclosure, the doping mass fraction of the water-absorbing organic compound may be $5/10000$. Furthermore, the precursor materials used for the hole transport layer, for example a TCTA precursor, may also be doped with the oxygen-absorbing organic compound having a doping mass fraction of $5/10000$ prior to being thermal evaporated. According to an example of the present disclosure, the oxygen-absorbing organic compound may be ascorbic acid and a derivative thereof which are easy to be oxidized. Because only a trace of the water-absorbing organic compound and the oxygen-absorbing organic compound are doped, the hole transport ability of the hole transport layer may not be affected.

The light emitting material layer is deposited on the hole transport layer by the vacuum thermal evaporation method. In an example of the present disclosure, the light emitting material layer may include a mixed-type main light emitting layer and an auxiliary light emitting layer. The mixed-type main light emitting layer includes TCTA and 1,2,4-triazole derivative (3,5-diphenyl-4-naphthalene-1-yl-1,2,4-triazole, TAZ), in which the TCTA is co-doped with a green phosphorescent material of fac-tris(2-phenylpyridine)iridium (Ir(ppy)3) and a red phosphorescent material of bis(2,4-diphenyl-quinoline) iridium(III) acetylanetonate (Ir(pq)$_2$acac). The auxiliary light emitting layer includes N',N-dicarbazolyl-3,5-benzene (mCP) doped with a blue phosphorescent material of tris((3,5-difluoro-4-cyanophenyl)pyridine)iridium(FCNIr). According to a principle of colorimetry, one light emitting layer doped with red, green and blue light emitting materials generates white lights by color mixing.

The electron transport layer is deposited on the light emitting layer through the vacuum thermal evaporation method. In an example of the present disclosure, the electron transport layer may be made of quinoline aluminum (Alq3) having an excellent electron transport ability, or may be made of BCP (Bathocuproine), 4,7-diphenyl-1,10-phenanthroline (Bphen), 1,3,5-tri(N-phenyl-benzimidazol-2-yl)benzene (TPBi), hydroxyquinolinolate-lithium (Liq), 2,9-bis(2-naphthyl)-4,7-diphenyl-1,10-phenanthroline (Nbphen), or 1,2,4-triazole derivative (TAZ). The precursor materials used for the electron transport layer, for example a Alq3 precursor, may be doped with the water-absorbing organic compound prior to being thermal evaporated. In an example of the present disclosure, the water-absorbing organic compound may be an aluminum-based composite. In a further example of the present disclosure, the water-absorbing organic compound may have a doping mass fraction of $1/1000$ or less. In another example of the present disclosure, the doping mass fraction of the water-absorbing organic compound may be $5/10000$. Furthermore, the precursor materials used for the electron transport layer, for example a Alq3 precursor, may be doped with the oxygen-absorbing organic compound having a doping mass fraction of $5/10000$ prior to being thermal evaporated. In an example of the present disclosure, the oxygen-absorbing organic compound may be ascorbic acid and a derivative thereof, which are easy to be oxidized. Because only a trace of the water-absorbing organic compound and the oxygen-absorbing organic compound are doped, the electron transport ability of the electron transport layer may not be affected.

The electron injection layer is deposited on the electron transport layer by the vacuum thermal evaporation method. In an example of the present disclosure, the electron injection layer may be made of a low working function material such as LiF, which has an excellent electron injection ability, or may be made of lithiumtetra-(8-hydroxy-quinolinato)boron (LiBq4) or Alq3:Li$_3$N (in which Li$_3$N is an n-type doping agent, and Alq3 is the doped material). The precursor materials used for electron injection layer, for example a LiF precursor, may be doped with the water-absorbing organic compound prior to being thermal evaporated. In an example of the present disclosure, the water-absorbing organic compound may be an aluminum-based composite. In a further example of the present disclosure, the water-absorbing organic compound may have a doping mass fraction of $1/1000$ or less. In another example of the present disclosure, the doping mass fraction of the water-absorbing organic compound may be $5/10000$. Furthermore, the precursor materials used for the electron injection layer, for example a LiF precursor, may be doped with the oxygen-absorbing organic compound having a doping mass fraction of $5/10000$ prior to being thermal evaporated. In an example of the present disclosure, the oxygen-absorbing organic compound may be ascorbic acid and a derivative thereof, which are easy to be oxidized. Because only a trace of the water-absorbing organic compound and the oxygen-absorbing organic compound are doped, the electron injection ability of the electron injection layer may not be affected.

The Mg/Al cathode layer with a low resistance is deposited on the electron injection layer by the vacuum thermal evaporation method. A voltage is applied between the cathode layer and the anode layer through an external circuit. An electron is injected by means of the cathode, a hole is injected by means of the anode, and thereby to form an exciton when the electron and the hole bind together, so as to excite the light emitting material emitting lights.

After the above-described steps for manufacturing the OLED device, generally a film packaging layer is formed on the OLED display device. The method for forming the film packaging layer includes the following steps of: condensing evaporated liquid solution on the OLED device manufactured by the above-described steps in the form of liquid under a vacuum environment, and drying formed film, so as to completely seal and flatten the whole OLED structure. The liquid solution used may be a hydrocarbon solution containing an aluminum-based composite, and other organic compounds being capable of blocking water and oxygen.

Embodiments of the present disclosure further provide an OLED display apparatus, including the above-described OLED display device and a diver circuit.

After an OLED device has been used for a while, it may be penetrated with a trace of water and oxygen from external environment. The water and oxygen firstly enter into the hole injection layer, the hole transport layer, the electron injection layer and the electron transport layer, and then enter into the light emitting material layer located in the most inner side of the OLED. Because all of the hole injection layer, the hole transport layer, the electron injection layer, and the electron transport layer are doped with the trace of the water-absorbing organic compound and the oxygen-absorbing organic compound, the water-absorbing organic compound preferentially reacts with stream to consume these steam; and the oxygen-absorbing organic compound (such as ascorbic acid and derivatives thereof) preferentially reacts with oxygen to consume the entered oxygen because it has a strong reducibility and is easy to be oxidized, thereby to prevent the trace of water and oxygen penetrating into the light emitting material layer from environment, avoid generating badness such as dark spots in the light emitting area, and improve a display quality and a display serving-life. At the same time, it may also protect other organic function layers, and effectively avoid the erosion by water and oxygen, thereby to effectively prolong the serving-life of the OLED display device.

The above are merely the preferred embodiments of the present disclosure. It should be noted that, a person skilled in the art may further make improvements and modifications without departing from the principle of the present invention, and these improvements and modifications shall also be considered as the scope of the present disclosure.

What is claimed is:

1. An OLED display device, comprising: a base substrate, an anode layer, a hole injection layer, a hole transport layer, a light emitting material layer, an electron transport layer, an electron injection layer, a cathode layer and a packaging layer, wherein the hole injection layer, the hole transport layer, the electron transport layer and/or the electron injection layer are doped with a water-absorbing organic compound and an oxygen-absorbing organic compound.

2. The OLED display device according to claim 1, wherein a mass sum of the water-absorbing organic compound and the oxygen-absorbing organic compound doped in any one of the hole injection layer, the hole transport layer, the electron transport layer and the electron injection layer is $1/1000$ or less of a total mass of each layer.

3. The OLED display device according to claim 1, wherein the water-absorbing organic compound is an aluminum-based composite, and the oxygen-absorbing organic compound is ascorbic acid and a derivative thereof.

4. The OLED display device according to claim 1, wherein the hole injection layer is made of F4TCNQ, TCNQ, PPDN, CuPC or TiOPC.

5. The OLED display device according to claim 1, wherein the hole transport layer is made of F4TCNQ, TCNQ, PPDN, CuPC, TiOPC or TCTA.

6. The OLED display device according to claim 1, wherein the electron transport layer is made of BCP, Bphen, TPBi, Alq3, Liq, Nbphen or TAZ.

7. The OLED display device according to claim 1, wherein the electron injection layer is made of LiF, LiBq4 or Alq3:$Li_3N$.

8. An OLED display apparatus, comprising the OLED display device according to claim 1 and a drive circuit.

9. An OLED display apparatus, comprising the OLED display device according to claim 2 and a drive circuit.

10. An OLED display apparatus, comprising the OLED display device according to claim 3 and a drive circuit.

11. A method for manufacturing an OLED display device, comprising steps of: providing a base substrate; forming an anode layer; forming a hole injection layer; forming a hole transport layer; forming a light emitting material layer; forming an electron transport layer; forming an electron injection layer; forming a cathode layer; and forming a packaging layer,
wherein the method further comprises a step of doping a water-absorbing organic compound and an oxygen-absorbing organic compound into the hole injection layer, the hole transport layer, the electron transport layer and/or the electron injection layer; or into materials for forming the hole injection layer, the hole transport layer, the electron transport layer and/or the electron injection layer.

12. The method according to claim 11, wherein a mass sum of the water-absorbing organic compound and the oxygen-absorbing organic compound doped in any one of the hole injection layer, the hole transport layer, the electron transport layer and the electron injection layer is $1/1000$ or less of a total mass of each layer.

13. The method according to claim 11, wherein the water-absorbing organic compound is an aluminum-based composite, and the oxygen-absorbing organic compound is ascorbic acid and a derivative thereof.

* * * * *